United States Patent [19]
Nishihara

[11] Patent Number: 6,072,208
[45] Date of Patent: Jun. 6, 2000

[54] DYNAMIC RANDOM ACCESS MEMORY FABRICATED WITH SOI SUBSTRATE

[75] Inventor: Toshiyuki Nishihara, Kanagawa, Japan

[73] Assignee: Sony Corporation, Tokyo, Japan

[21] Appl. No.: 07/805,967

[22] Filed: Dec. 12, 1991

[30] Foreign Application Priority Data

Dec. 17, 1990 [JP] Japan ..................................... 2-411136

[51] Int. Cl.[7] ........................... H01L 29/68; H01L 29/78; H01L 29/92
[52] U.S. Cl. ............................ 257/296; 257/301; 257/71; 257/350
[58] Field of Search ...................................... 257/296, 301, 257/303, 68, 71, 306, 304, 305, 311, 350

[56] References Cited

FOREIGN PATENT DOCUMENTS 61-42949 3/1986 Japan ..................................... 257/296
63-44755 2/1988 Japan ..................................... 257/296

*Primary Examiner*—Jerome Jackson
*Assistant Examiner*—D. Monin
*Attorney, Agent, or Firm*—Hill, Steadman & Simpson

[57] ABSTRACT

In a dynamic random access memory (DRAM), a step produced by forming a stacked capacitor can be prevented from being produced and increased, thereby facilitating the patterning of an upper layer (wiring, etc.). Further, the pattern layout can be made with freedom and the DRAM itself can be highly integrated. This dynamic random access memory is constructed such that stacked capacitors ($C_1$), ($C_2$) composed of accumulation node electrodes (7a), (7b), a dielectric layer (8) and a sub-plate electrode (9) are formed on the under layers of a switching element (Tr1) composed of a word line (4a) and two source-drain regions (5a), (5b) and a switching element (Tr2) composed of a word line (4b) and two source-drain regions (5a), (5c).

2 Claims, 5 Drawing Sheets

DYNAMIC RANDOM ACCESS MEMORY FABRICATED WITH SOI SUBSTRATE

BACKGROUND OF THE INVENTION

1. Field of the Invention

The present invention generally relates to dynamic random access memories and, more particularly, is directed to a dynamic random access memory in which a stacked capacitor for charge accumulation is connected to a switching element.

2. Description of the Prior Art

Recently, a stacked capacitor cell having a capacitor of a stacked type structure for storing informations has been utilized in order to keep a capacitance as semiconductor memories such as a dynamic random access memory (DRAM) or the like are highly integrated. This type of semiconductor memory is reported in international electron devices meeting held on Dec. 11, 1988, pp.596–599.

As shown in FIG. 1, in a conventional semiconductor memory having a stacked capacitor, an impurity diffusion layer 33 of a switching element Tr is formed to face the surface of a silicon substrate 32 on which a field insulating layer 31 is formed. One source-drain region 33a of the impurity diffusion region 33 is connected with a bit line 35 formed, for example, of an Al wiring layer through a contact hole 34, and the other source-drain region 33b is connected with a capacitor lower portion electrode 36 of a stacked capacitor C.

The capacitor lower portion electrode 36 is formed by the patterning-process of a polycrystalline silicon layer of the second layer. This capacitor lower portion electrode 36 is formed up to the upper portion of each gate electrode 37 of the switching element Tr which is a polycrystalline silicon layer of the first layer through an interlevel insulator 38. The capacitor lower portion electrode 36 has on its upper portion formed a capacitor upper portion electrode 39 as a common electrode through a dielectric layer 40, and a multilayer structure of these capacitor upper electrode 39, dielectric layer 40 and capacitor lower portion electrode 36 constructs the stacked capacitor C.

In this semiconductor memory device, necessary charges and so on are accumulated in the stacked capacitor C and the write and read therein and therefrom are carried out by means of the bit line 35 under the control of the switching element Tr.

However, since the conventional semiconductor memory device has the multilayer structure in which several polycrystalline silicon layer are stacked on the silicon substrate 32, a step at the contact portion in the memory cell portion is increased so that a step coverage in the contact hole or the like is deteriorated. There is then the disadvantage that the patterning-process on the upper layer, e.g., the patterning-process such as the bit line 35 or the like becomes difficult. Further, in order to increase the capacitance of the stacked capacitor C so as to cope with highly integrated semiconductor memories, a side wall of the capacitor lower portion electrode 36 which becomes an accumulation node must be effectively utilized. If so, then the step of the capacitor lower portion electrode 36 is increased. Accordingly, the step at the above-mentioned contact portion is increased, thus giving rise to the disconnection of the bit line 35 or the like.

Furthermore, if the step at the memory cell portion is increased, then the patterning-process of the wiring or the like becomes difficult in the connected portion with the peripheral circuit portion (e.g., address decoder or the like) where the step is relatively small due to a difference of depth of focus during the exposure.

OBJECTS AND SUMMARY OF THE INVENTION

Accordingly, it is an object of the present invention to provide an improved semiconductor memory in which the aforementioned shortcomings and disadvantages of the prior art can be eliminated.

More specifically, it is an object of the present invention to provide a semiconductor memory in which a step, produced by forming stacked capacitors, can be prevented from being produced and increased so that the patterning of an upper layer (wiring) can be facilitated and that the pattern layout can be made with freedom.

Another object of the present invention is to provide a semiconductor memory which can be highly integrated.

A further object of the present invention is to provide a semiconductor memory, the manufacturing process of which can be simplified.

A still further object of the present invention is to provide a semiconductor memory which can be made inexpensive.

To achieve the above-mentioned objects, according to the present invention, in a semiconductor memory device in which a memory cell is formed of a switching element and a charge accumulation capacitor connected to the switching element, the charge accumulation capacitor are formed on the under layers of the switching elements through an insulating layer.

Further, according to the present invention, in the semiconductor memory, the charge accumulation capacitors are formed on the under layers of the switching elements through the insulating layer, and a plate electrode forming the charge accumulation capacitors is supplied with a plate voltage from a plane (i.e., silicon substrate) on which the switching element is not formed.

According to the thus arranged semiconductor memory device of the present invention, since the stacked capacitor itself is buried into the under layer of the switching element, the step, produced by forming the stacked capacitor, can be prevented from being produced and increased. As a consequence, the upper bit line can be formed considerably easily and the pattern layout for the wiring or the like can be carried out with freedom. Furthermore, since a contact for the capacitor need not be provided between the adjacent word lines, on the upper portion of the silicon substrate, the spacing between the word lines can be reduced accordingly, which can make the memory device highly integrated effectively.

Furthermore, according the thus arranged semiconductor memory device of the present invention, the above-mentioned action and effects can be achieved and the process for leading out the plate voltage to the surface of the silicon substrate is not required so that the manufacturing process of this semiconductor memory device can be simplified and that the semiconductor memory device of the present invention can be made inexpensive. In addition, through applying a bias potential to an accumulation node electrode from a back surface of a silicon substrate, the interference noise to the accumulation node can be reduced, and the potential of the accumulation node can be stabilized.

The preceding and other objects, features, and advantages of the present invention will become apparent from the following detailed description of illustrative embodiments thereof to be read in conjunction with the accompanying

DETAILED DESCRIPTION OF SPECIFIC EMBODIMENTS

The present invention will now be described with reference to FIGS. 2 through 5.

Figure 1:
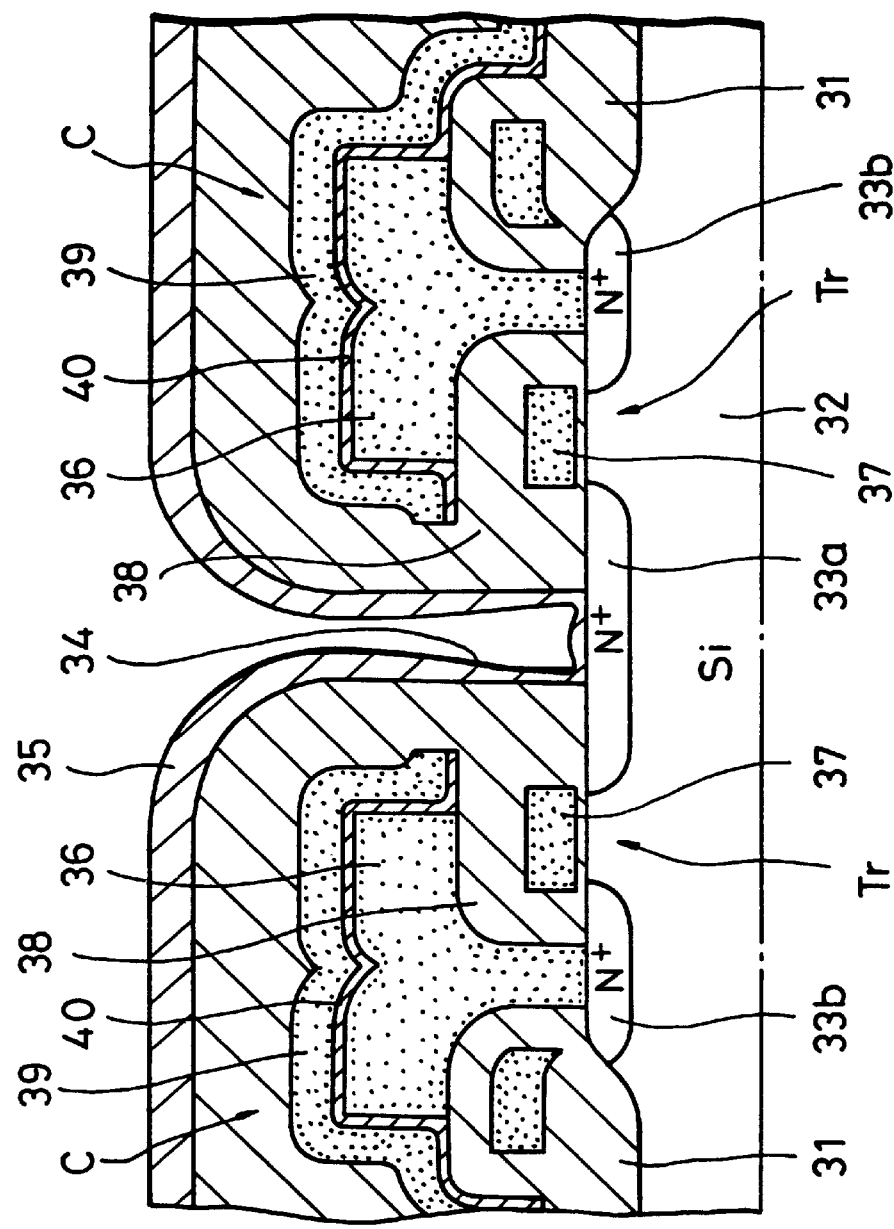
FIG. 1 is a diagrammatic view of a section of a main portion of an example of a dynamic random access memory according to the prior art.
Figure 2:
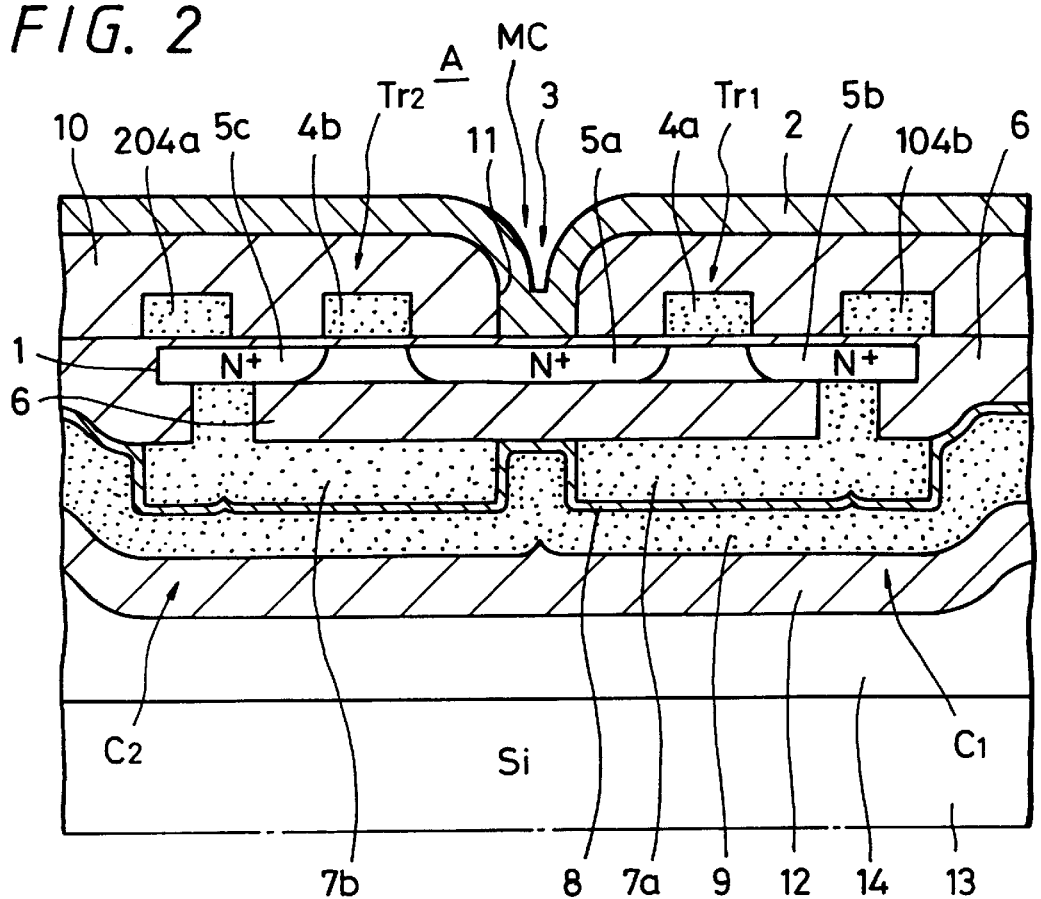
FIG. 2 is a diagrammatic view of a section showing a main portion of a dynamic random access memory according to a first embodiment of the present invention.
Figure 3:
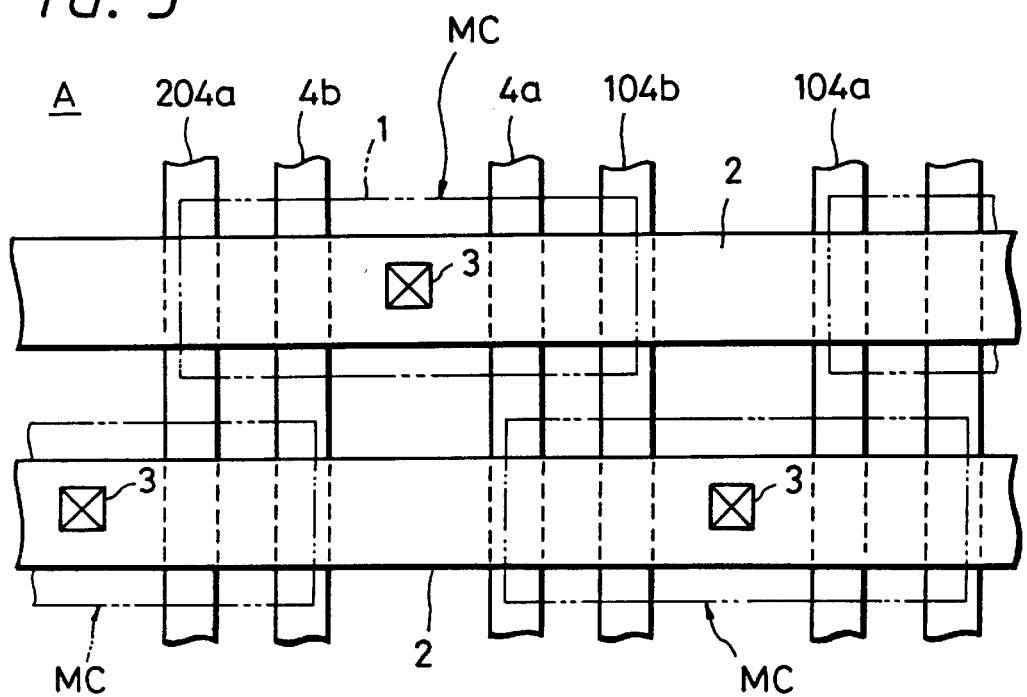
FIG. 3 is a plain view illustrating the main portion of the dynamic random access memory according to the first embodiment of the present invention.

FIG. 2 shows a sectional view of a main portion of a semiconductor memory device A, particularly, a dynamic random access memory (DRAM) according to the first embodiment of the present invention, and FIG. 3 is a plan view thereof.

Referring initially to FIG. 3, it will be seen that the memory device A has formed at the central portion of an element forming region 1 encircled by an insulating layer formed of SiO$_2$ or the like a contact portion 3 for a bit line 2 extending in the lateral direction. Two word lines 4a and 4b are symmetrically formed at left and right sides of the contact portion 3 so as to extend in the vertical direction. As shown in FIG. 2, one electrode 7a formed of a polycrystalline silicon layer so as to become an accumulation node (hereinafter referred to as an accumulation node electrode 7a) is formed through an insulating layer 6 under a switching element Tr1 composed of one word line 4a, an N type source-drain region 5a formed beneath the contact portion 3 and an N type source-drain region 5b formed at the right-hand side of the word line 4a from a sheet of drawing standpoint. This accumulation node electrode 7a and the above source-drain region 5b are electrically connected with each other. An accumulation node electrode 7b is formed through the insulating layer 6 under a switching element Tr2 composed of the other word line 4b, the source-drain region 5a formed under the contact portion 3 and an N$^+$ type source-drain region 5c formed at the left-hand side of the word line 4b. This accumulation node electrode 7b and the source-drain region 5c are electrically connected with each other.

As shown in FIG. 2, a sub-plate electrode 9 of a common electrode formed of a polycrystalline silicon layer is formed on the under surface including the accumulation node electrodes 7a and 7b through a dielectric thin layer 8 such as SiO$_2$, SiN or the like. The sub-plate electrode 9, the dielectric layer 8 and the accumulation node electrodes 7a, 7b constitute stacked capacitors C$_1$ and C$_2$, respectively. In FIG. 2, the bit line 2 is connected to the source-drain region 5a through an aperture 11 which penetrates an interlevel layer 10 formed of an SiO$_2$ or the like.

These switching elements Tr1, Tr2 and stacked capacitors C$_1$, C$_2$ constitute a single memory cell (storage capacity of 2 bits) MC, and the memory cell MC is alternately formed along the vertical direction in a so-called folded bit line arrangement fashion as shown in FIG. 3.

In FIG. 2, reference numerals 204a and 104b depict word lines of other memory cells MC which are formed adjacent to the foregoing memory cell MC in the vertical direction as shown in FIG. 3. Also in FIG. 2, reference numeral 12 depicts an insulating layer made of SiO$_2$ or the like which insulates the sub-plate electrode (plate potential) 9 and a silicon substrate (substrate potential) 13, and reference numeral 14 depicts a polycrystalline silicon layer used for the planarization technology.

A method of manufacturing the memory device A according to the first embodiment of the present invention will be described below with reference to FIGS. 4A to 4E. Throughout FIGS. 4A to 4E, like parts corresponding to those of FIGS. 2 and 3 are marked with the same references.

Figure 4A:
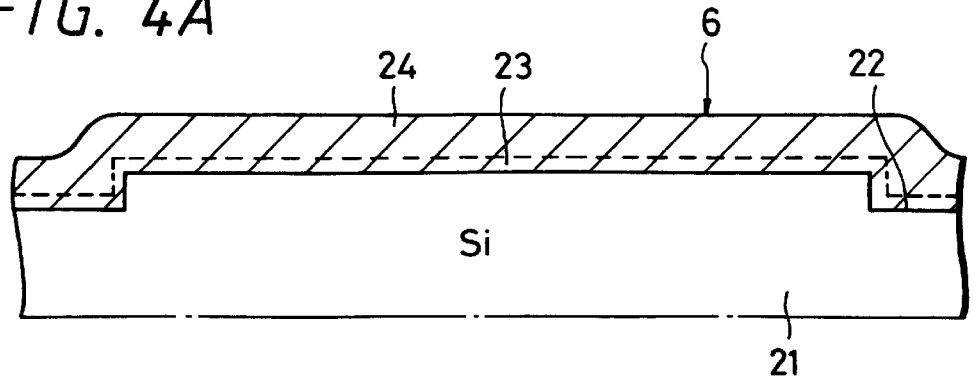
FIGS. 4A through 4E are respectively sectional views illustrating a manufacturing process of the dynamic random access memory according to the first embodiment of the present invention.

Referring initially to FIG. 4A, a predetermined portion on a silicon substrate 21, in this embodiment, a silicon surface of a portion which becomes an element isolation region is selectively etched away by a thickness of, for example, about 2000 Å by the etching-process thereby to form a concave portion 22. Then, the whole surface of the silicon substrate 21 is treated by a thermal oxidation process to form a thermally-oxidized film 23. In this case, the thickness of this thermally-oxidized film 23 corresponds to the thickness ranging from the silicon surface to a broken line in FIG. 4A. Thereafter, an insulating layer 24 made of SiO$_2$ is deposited on the thermally-oxidized layer 23 by, for example, the chemical vapor deposition (CVD) method. In the following description, the thermally-oxidized layer 23 and the insulating layer 24 will be collectively referred to as an insulating layer 6.

Figure 4B:
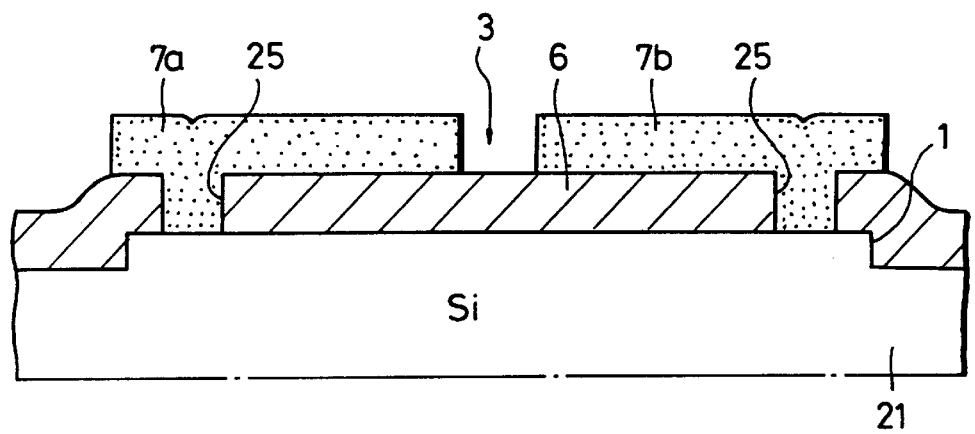

Then, as shown in FIG. 4B, two apertures 25 are respectively formed, which pass through the above-mentioned insulating layer 6 at predetermined positions on the element forming region 1 of the silicon substrate 21. Thereafter, accumulation node electrodes 7a and 7b made of polycrystalline silicon layers are respectively formed so as to oppose these apertures 25 by the patterning-process. Each of these accumulation electrodes 7a and 7b has a width such that one end thereof is extended to the contact portion 3 for the bit line 2 regardless of the contact portion 3 and the other end thereof is slightly protruded from the element forming region 1.

Figure 4C:
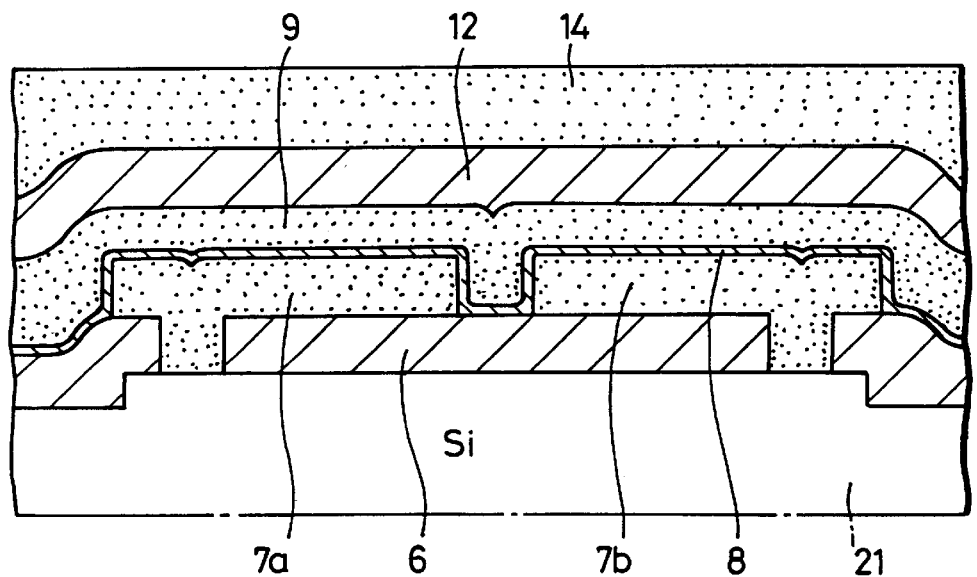

Then, as shown in FIG. 4C, a thin film dielectric layer 8 is formed on the whole surface including the accumulation node electrodes 7a and 7b by, for example, the low pressure CVD method as shown in FIG. 4C, and then a sub-plate electrode 9 of a common electrode made of a polycrystalline silicon layer is formed on the dielectric layer 8. Thereafter, an insulating layer 12 made of SiO$_2$ is formed on the whole surface and then a polycrystalline silicon layer 14 is formed on the whole surface thereof. Then, the surface of the polycrystalline silicon layer 14 is flattened by the known planarization technology (e.g., polishing process or the like).

Figure 4D:
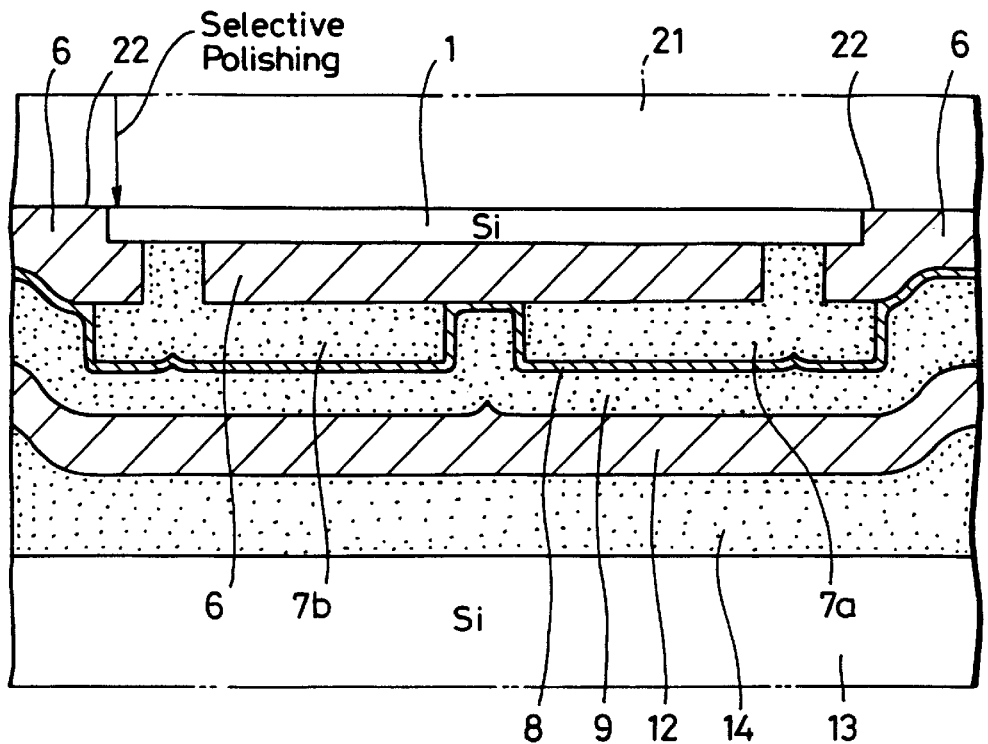

Then, as shown in FIG. 4D, another silicon substrate 13 is bonded to the end face of the thus flattened polycrystalline silicon layer 14 and then the rear surface of the other silicon substrate 21 is polished selectively. This selective polishing process is continued until the insulating layer 6 is exposed. By this selective polishing process, the silicon thin layer of an island configuration encircled by the insulating layer 6, i.e., the element forming region 1 is formed and an element isolation region 22 is formed by the insulating layer 6.

Figure 4E:
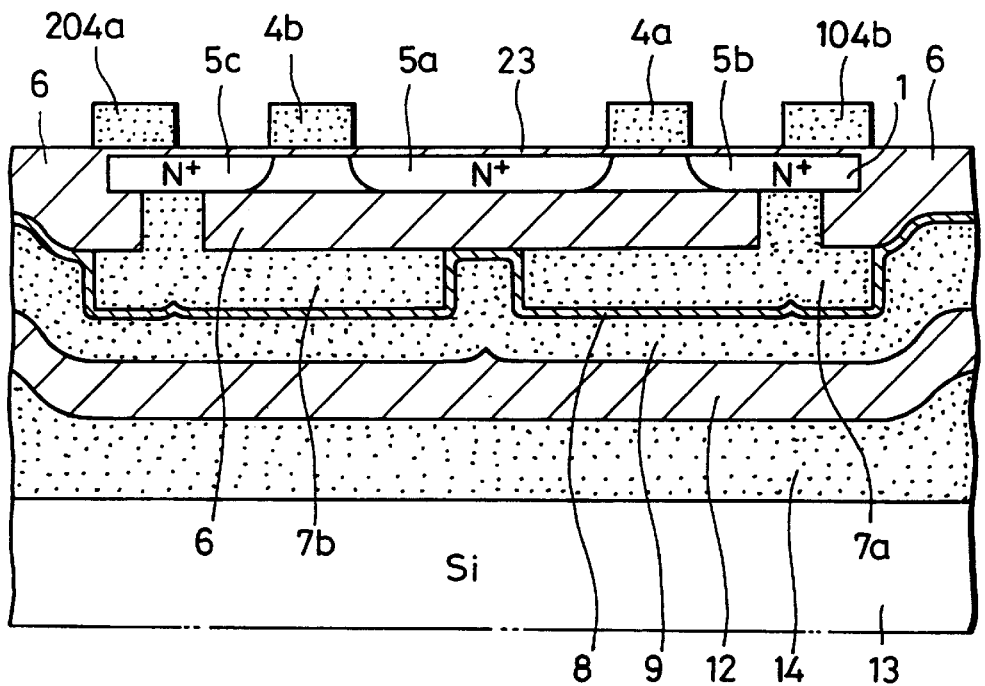

Then, as shown in FIG. 4E, a thin thermally-oxidized film, i.e., a gate insulating layer 23 is formed on the surface of the element forming region 1 by thermally oxidizing the whole surface, and then the word lines 4a and 4b (and the word lines 204a and 104b) made of polycrystalline silicon layers are formed by the patterning-process. Thereafter, three source-drain regions 5a, 5b and 5c are respectively formed on the element forming region 1 by the ion implantation technique of, for example, N type impurities while the word lines 4a and 4b are employed as a mask. At that very moment, the switching elements Tr1 and Tr2 are formed.

Referring back to FIG. 2, the interlevel layer 10 made of $SiO_2$ or the like is formed on the whole surface and then an aperture 11 is bored through the interlevel layer 10 at its portion corresponding to the source-drain region 5a. At that time, since only the interlevel layer 10 exists on the word lines 4a and 4b, the step coverage of the aperture 11 is improved. Thereafter, the bit line 2 made of metal is formed on the interlevel layer 10 by the patterning-process, thereby the semiconductor memory device A according to this embodiment being produced. The accumulation electrodes 7a and 7b are applied with potentials ranging from 0 to Vcc by the operation of the corresponding switching elements Tr1 and Tr2, and a fixed potential of ½ Vcc is applied to the sub-plate electrode 9.

As described above, according to this embodiment, since the stacked capacitors $C_1$ and $C_2$ themselves are buried under the respective switching elements Tr1 and Tr2, the step, produced by forming the stacked capacitors $C_1$ and $C_2$, can be prevented from being produced and increased. As a consequence, the upper bit line 2 can be formed considerably easily and the pattern layout of the wiring of the bit line 2 or the like can be carried out with freedom. Furthermore, since a contact for the accumulation node electrode 7a need not be provided between the adjacent word lines, e.g., adjacent word lines 4a and 104b on the upper portion of the silicon substrate 13, the memory cell MC can be reduced in area and the memory device A itself can be highly integrated. In addition, since the step on the upper portion of the silicon substrate 13 is reduced, the wiring at the connected portion with the peripheral circuit portion can be carried out with ease and at high accuracy. Furthermore, the interference noise to the accumulation nodes 7a and 7b can be reduced by forming the insulating layer 6 thick enough.

Figure 5:
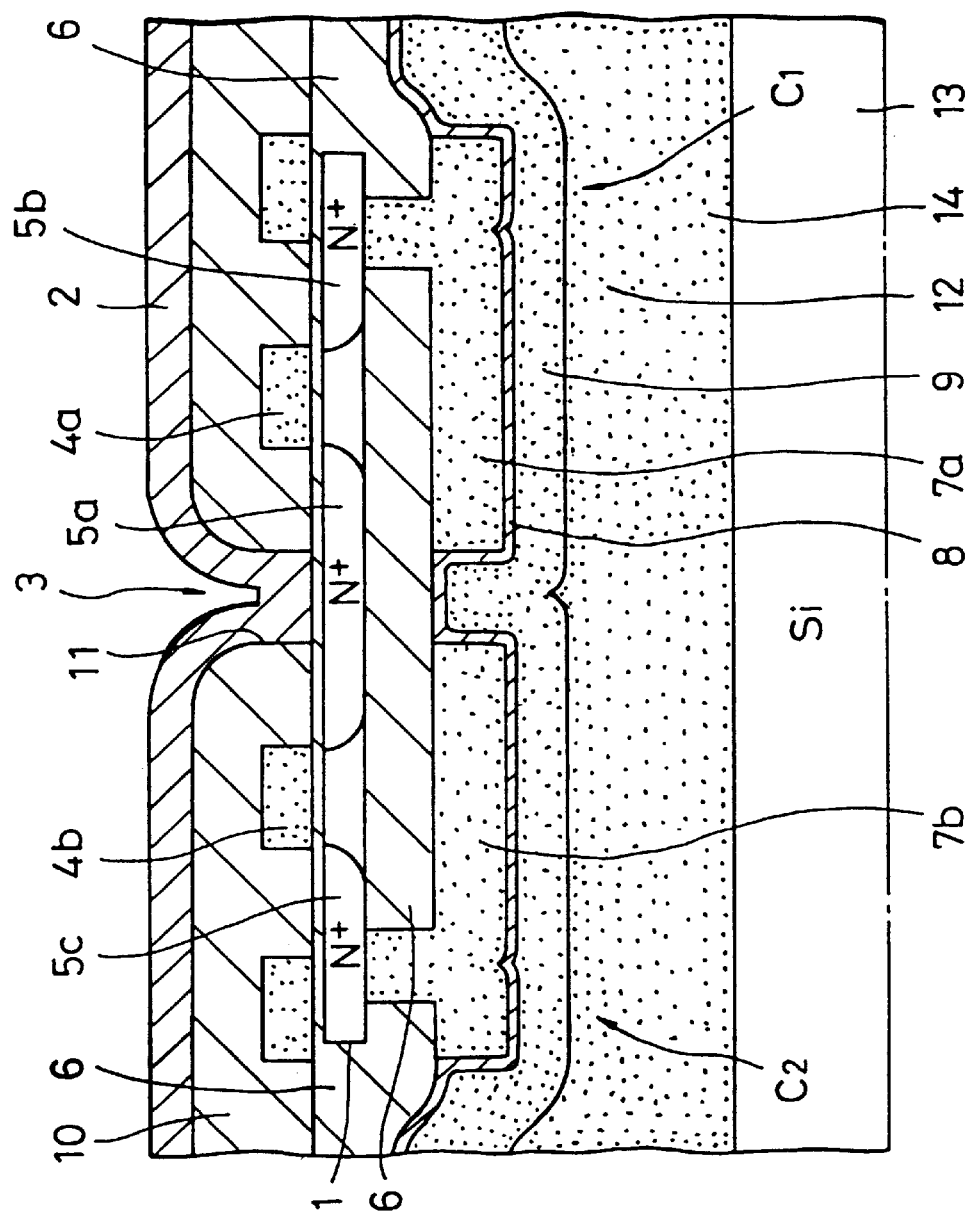
FIG. 5 is a diagrammatic view of a section of a main portion of the dynamic random access memory according to a second embodiment of the present invention.

While the insulating film 12 is interposed between the sub-plate electrode 9 and the silicon substrate 13 in the first embodiment, the present invention is not limited thereto and such a variant is also possible. That is, as shown in FIG. 5, the above-mentioned insulating layer 12 is removed and the sub-plate electrode 9 and the silicon substrate 13 may be directly and electrically connected to each other (in actual practice, between the sub-plate electrode 9 and the silicon substrate 13, there exists the polycrystalline silicon layer 14 provided as the flattened layer). In this case, since the substrate potential itself becomes a plate voltage source, the process for leading out the plate voltage source to the silicon surface is not required. Therefore, in cooperation with the removal of the insulating layer 12, the manufacturing process of the semiconductor memory device can be simplified and this semiconductor memory device can be made inexpensive.

While the present invention is applied to the arrangement of the folded bit line type as described above, the present invention is not limited thereto and may be applied to the arrangement of a so-called open bit line type.

Although preferred embodiments of the invention have been described in detail herein with reference to the accompanying drawings, it is to be understood that the invention is not limited to those precise embodiments, and that various changes and modifications thereof may be effected therein by one skilled in the art without departing from the scope or spirit of the invention as defined in the appended claims.

What is claimed is:

1. A semiconductor memory device comprising:

a switching element having a source region, a drain region, and a channel region arranged between said source region and said drain region, said switching element formed on a thin semiconductor layer; and a capacitive element having an accumulation electrode connected to said source region through an insulating film, a dielectric layer arranged below said accumulation electrode, and a plate electrode capacitively coupled to said accumulation electrode through said dielectric layer, said accumulation electrode and said channel region partially overlap one another, and said plate electrode being formed over a flattening layer on a supporting substrate, said flattening layer being a composite laminate of an insulating layer and a polycrystalline silicon layer.

2. A semiconductor memory device comprising:

a switching element having a source region, a drain region, and a channel region arranged between said source region and said drain region, said switching element formed on a thin semiconductor layer of an island configuration encircled by a first insulating layer; and a capacitive element having an accumulation electrode connected to said source region through said first insulating layer, a dielectric layer arranged below said accumulation electrode, and a plate electrode capacitively coupled to said accumulation electrode through said dielectric layer, said accumulation electrode and said channel region partially overlapping one another, and said plate electrode being formed over a flattening layer on a supporting substrate, said flattening layer being a composite laminate of a second insulating layer and a polycrystalline silicon layer.

* * * * *